United States Patent
Yang

(10) Patent No.: US 12,289,853 B2
(45) Date of Patent: Apr. 29, 2025

(54) MOUNTING ASSEMBLY AND SERVER

(71) Applicants: INVENTEC (PUDONG) TECHNOLOGY CORPORATION, Shanghai (CN); INVENTEC CORPORATION, Taipei (TW)

(72) Inventor: Chi-Chun Yang, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 213 days.

(21) Appl. No.: 18/208,716

(22) Filed: Jun. 12, 2023

(65) Prior Publication Data

US 2024/0306335 A1 Sep. 12, 2024

(30) Foreign Application Priority Data

Mar. 6, 2023 (CN) .......................... 202310208326.2

(51) Int. Cl.
*G06F 1/18* (2006.01)
*H05K 7/14* (2006.01)

(52) U.S. Cl.
CPC ........... *H05K 7/1402* (2013.01); *G06F 1/185* (2013.01); *H05K 7/1489* (2013.01)

(58) Field of Classification Search
CPC ..... G06F 1/185; H05K 7/1402; H05K 7/1489
USPC .................................................... 361/679.32
See application file for complete search history.

(56) References Cited

U.S. PATENT DOCUMENTS

| | | | | |
|---|---|---|---|---|
| 3,701,071 A | * | 10/1972 | Landman | H01R 12/714 439/71 |
| 4,715,819 A | * | 12/1987 | Iwasa | H01R 12/722 439/31 |
| 4,863,388 A | * | 9/1989 | Reimer | H01R 12/83 439/31 |
| 5,136,465 A | * | 8/1992 | Benck | G06F 1/20 361/679.48 |
| 5,162,979 A | * | 11/1992 | Anzelone | G06F 13/409 439/157 |
| 5,169,221 A | * | 12/1992 | Wheeler | H05K 7/16 248/299.1 |
| 5,544,006 A | * | 8/1996 | Radloff | G06F 1/186 361/756 |
| 5,584,396 A | * | 12/1996 | Schmitt | H02B 1/36 211/26 |

(Continued)

*Primary Examiner* — Adrian S Wilson
(74) *Attorney, Agent, or Firm* — Maschoff Brennan

(57) ABSTRACT

The invention provides a mounting assembly and a server. The mounting assembly includes fixed base, adjustable base, first protrusion and second protrusion. Adjustable base is rotatably disposed on fixed base. When adjustable base is at first mounting position, first protrusion protrudes from adjustable base along protruding direction and is configured for horizontal installation and removal of first expansion card with respect to motherboard. When adjustable base is at second mounting position, second protrusion protrudes from adjustable base along protruding direction and is configured for vertical installation and removal of second expansion card with respect to motherboard. A position at which first protrusion is located when protruding along protruding direction is different from position at which second protrusion is located when protruding along protruding direction.

10 Claims, 5 Drawing Sheets

(56) References Cited

U.S. PATENT DOCUMENTS

| | | | | |
|---|---|---|---|---|
| 5,704,793 A * | 1/1998 | Stokoe | H01R 12/62 | 439/62 |
| 5,734,551 A * | 3/1998 | Hileman | G06F 1/185 | 361/801 |
| 5,784,251 A * | 7/1998 | Miller | G06F 1/187 | 361/725 |
| 5,995,364 A * | 11/1999 | McAnally | G06F 1/187 | 361/725 |
| 6,004,142 A * | 12/1999 | Wark | G01R 31/2808 | 439/74 |
| 6,349,042 B1 * | 2/2002 | Mills | G06F 1/182 | 174/359 |
| 6,442,037 B1 * | 8/2002 | Boe | H05K 7/1408 | 361/801 |
| 6,781,841 B2 * | 8/2004 | Kim | G11B 33/128 | |
| 6,813,156 B2 * | 11/2004 | Park | G06F 1/188 | 361/721 |
| 6,822,878 B2 * | 11/2004 | Dobbs | H05K 1/148 | 361/752 |
| 6,896,548 B2 * | 5/2005 | Scuteri | G06K 19/07741 | 439/541.5 |
| 7,924,558 B2 * | 4/2011 | Crippen | G06F 1/185 | 439/71 |
| 10,624,211 B2 * | 4/2020 | Huang | G06F 1/185 | |
| 10,624,226 B1 * | 4/2020 | Alvarado | H05K 7/1408 | |
| 2003/0193782 A1 * | 10/2003 | Chen | G06F 1/188 | 361/679.02 |
| 2008/0070424 A1 * | 3/2008 | Mullady | H01R 12/88 | 439/55 |
| 2008/0137280 A1 * | 6/2008 | Chen | G06F 1/188 | 361/726 |
| 2011/0051342 A1 * | 3/2011 | Crippen | H01R 12/83 | 439/59 |
| 2011/0110032 A1 * | 5/2011 | Kuo | G06F 1/185 | 248/291.1 |
| 2024/0306339 A1 * | 9/2024 | Yang | H05K 7/1487 | |

\* cited by examiner

MOUNTING ASSEMBLY AND SERVER

CROSS-REFERENCE TO RELATED APPLICATIONS

This non-provisional application claims priority under 35 U.S.C. § 119(a) on Patent Application No(s). 202310208326.2 filed in China, on Mar. 6, 2023, the entire contents of which are hereby incorporated by reference.

BACKGROUND OF THE INVENTION

Technical Field of the Invention

The invention relates to a mounting assembly and a server, more particularly to a mounting assembly for mounting expansion card and a server including the same.

Description of the Related Art

With the demand for the performance of an expansion card in a server increases, the expansion card should include more electronic components and have more complex structure, which increases the weight of the expansion card. Thus, in order to facilitate the expansion card to be installed on the motherboard, there may be a handle on the expansion card, and a mounting protrusion may be disposed on the motherboard via a bracket fixed to the motherboard. In this way, the installation of the expansion card and the motherboard can be completed in a labor-saving manner via the cooperation of the handle and the mounting protrusion.

When the expansion card should be installed on the motherboard along different directions according to the configuration of the server, the handle on the expansion card is required to cooperate with mounting protrusions at different positions. However, the conventional mounting protrusion is disposed on the bracket fixed to the motherboard, and thus is unable to meet such requirement. In detail, if multiple mounting protrusions are fixed on the motherboard via brackets at different positions, the manufacture cost or the difficulty of object management will be significantly increased.

SUMMARY OF THE INVENTION

The invention is to provide a mounting assembly that can mount the expansion card along different directions by itself and a server including the same, thereby preventing the manufacture cost or the difficulty of object management from being increased.

One embodiment of this invention provides a mounting assembly configured for an installation and a removal of a first expansion card or a second expansion card with respect to a motherboard. The mounting assembly includes a fixed base, an adjustable base, a first protrusion and a second protrusion. The fixed base is configured to be fixed to the motherboard. The adjustable base is rotatably disposed on the fixed base. The first protrusion and the second protrusion protrude from two different sides of the adjustable base, respectively. The adjustable base is configured to be rotated to a first mounting position or a second mounting position relative to the fixed base. When the adjustable base is at the first mounting position, the first protrusion protrudes from the adjustable base along a protruding direction and is configured for horizontal installation and removal of the first expansion card with respect to the motherboard. When the adjustable base is at the second mounting position, the second protrusion protrudes from the adjustable base along the protruding direction and is configured for vertical installation and removal of the second expansion card with respect to the motherboard. A position at which the first protrusion is located when protruding along the protruding direction is different from a position at which the second protrusion is located when protruding along the protruding direction.

Another embodiment of this invention provides a server configured for an installation and a removal of a first expansion card or a second expansion card. The server includes a motherboard and a mounting assembly. The mounting assembly includes a fixed base, an adjustable base, a first protrusion and a second protrusion. The fixed base is fixed to the motherboard. The adjustable base is rotatably disposed on the fixed base. The first protrusion and the second protrusion protruding from two different sides of the adjustable base, respectively. The adjustable base is configured to be rotated to a first mounting position or a second mounting position relative to the fixed base. When the adjustable base is at the first mounting position, the first protrusion protrudes from the adjustable base along a protruding direction and is configured for horizontal installation and removal of the first expansion card with respect to the motherboard. When the adjustable base is at the second mounting position, the second protrusion protrudes from the adjustable base along the protruding direction and is configured for vertical installation and removal of the second expansion card with respect to the motherboard. A position at which the first protrusion is located when protruding along the protruding direction is different from a position at which the second protrusion is located when protruding along the protruding direction.

According to the mounting assembly and the server disclosed by above embodiments, the adjustable base is rotatably disposed on the fixed base, and the first protrusion and the second protrusion protrude from two different sides of the adjustable base, respectively. Thus, according to the actual requirement, the adjustable base is allowed to be moved to the first mounting position or the second mounting position to enable the vertical or horizontal installation of the expansion card. In this way, the mounting assembly can facilitate the expansion card to be installed on the motherboard along different directions, while preventing the manufacture cost and the difficulty of object management from being increased.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
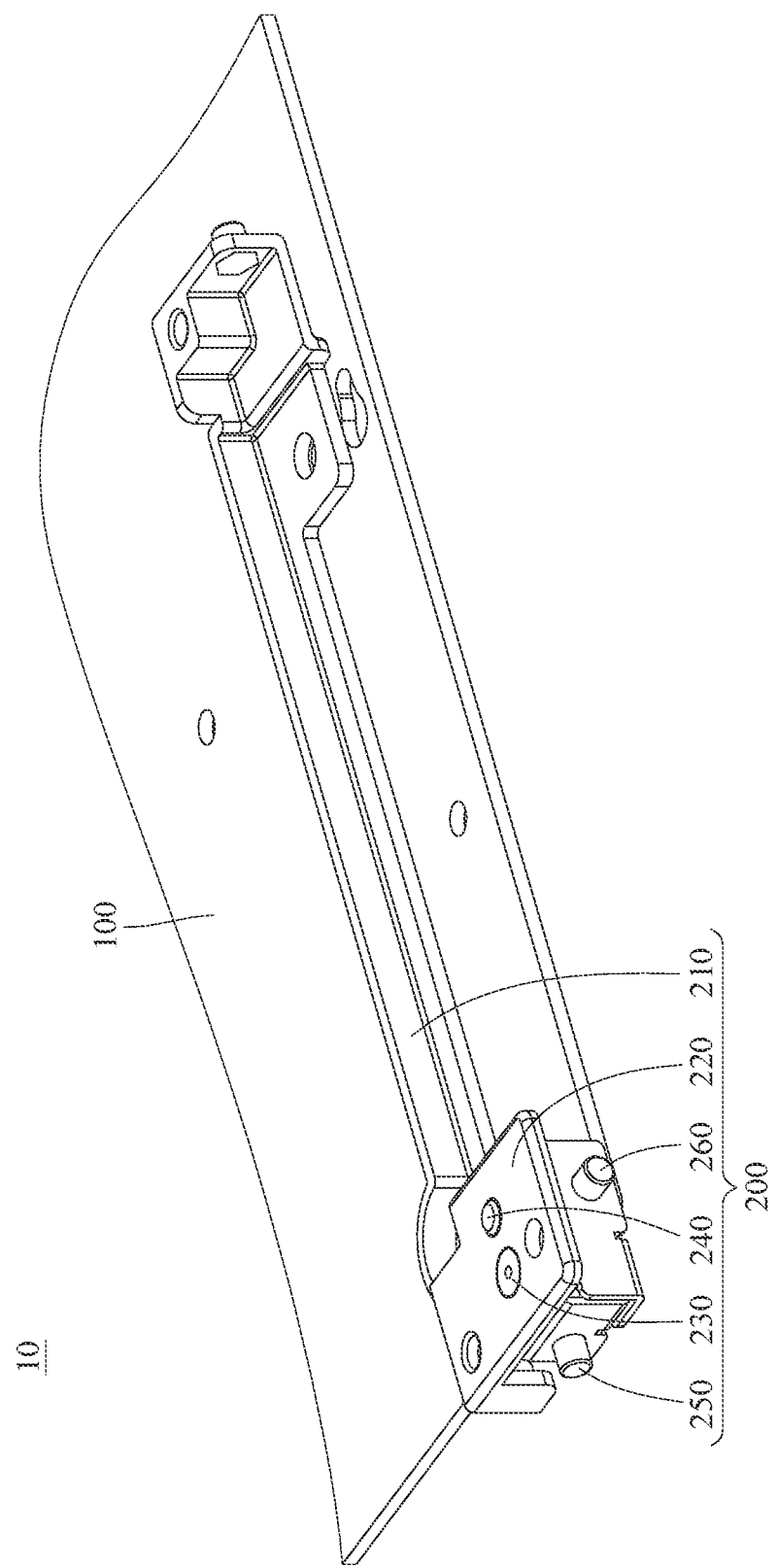
FIG. 1 is a partially enlarged perspective view showing that an adjustable base of a server according to one embodiment of the invention is at a first mounting position.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
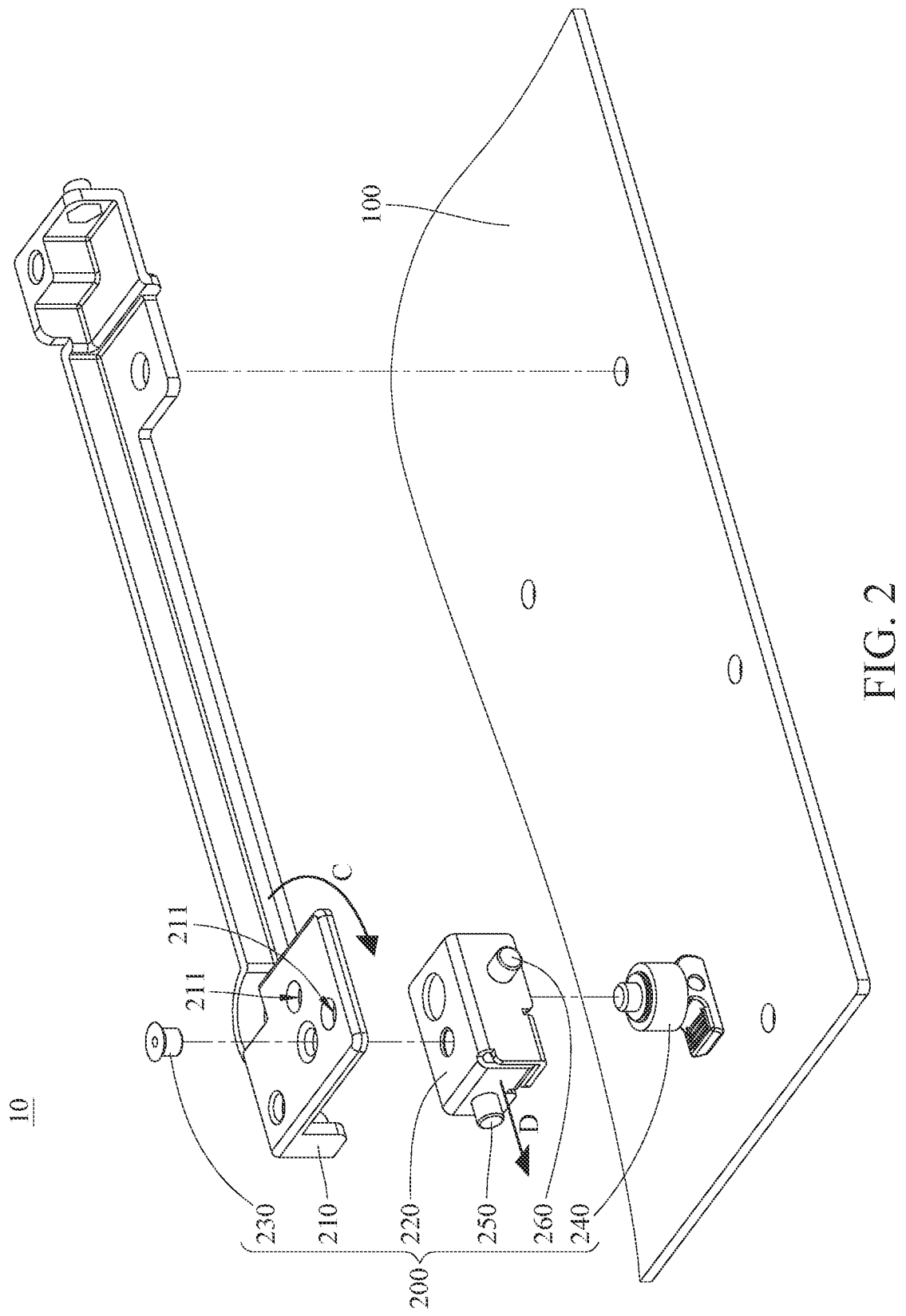
FIG. 2 is a partially enlarged view of the server in FIG. 1.

Please refer to FIGS. 1 and 2. FIG. 1 is a partially enlarged perspective view showing that an adjustable base 220 of a server 10 according to one embodiment of the invention is at a first mounting position. FIG. 2 is a partially enlarged view of the server 10 in FIG. 1.

In this embodiment, the server 10 includes a motherboard 100 and a mounting assembly 200. In this embodiment, the mounting assembly 200 includes a fixed base 210, the adjustable base 220, a pivot 230, a positioning component 240, a first protrusion 250 and a second protrusion 260.

The fixed base 210 is fixed to the motherboard 100. The adjustable base 220 is rotatably disposed on the fixed base 210. Specifically, in this embodiment, the adjustable base 220 is pivotally connected to the fixed base 210 via the pivot 230. In this embodiment, the fixed base 210 includes two positioning holes 211. The two positioning holes 211 are arranged along a circumferential direction C of the pivot 230. The positioning component 240 is disposed through the adjustable base 220, and the positioning component 240 may be, for example, a plunger. Note that in other embodiments, the mounting assembly 200 may not include the pivot 230 pivotally connecting the adjustable base 220 to the fixed base 210. Also, the adjustable base 220 may be rotatably disposed on the fixed base 210 via a bearing or other suitable structure. Note that in other embodiments, the mounting assembly 200 may not include the positioning component 240, and the fixed base 210 may not include the positioning hole 211.

The first protrusion 250 and the second protrusion 260 protrude from two different sides of the adjustable base 220, respectively. Specifically, in this embodiment, the first protrusion 250 and the second protrusion 260 protrude from two adjacent sides of the adjustable base 220, respectively.

Figure 3:
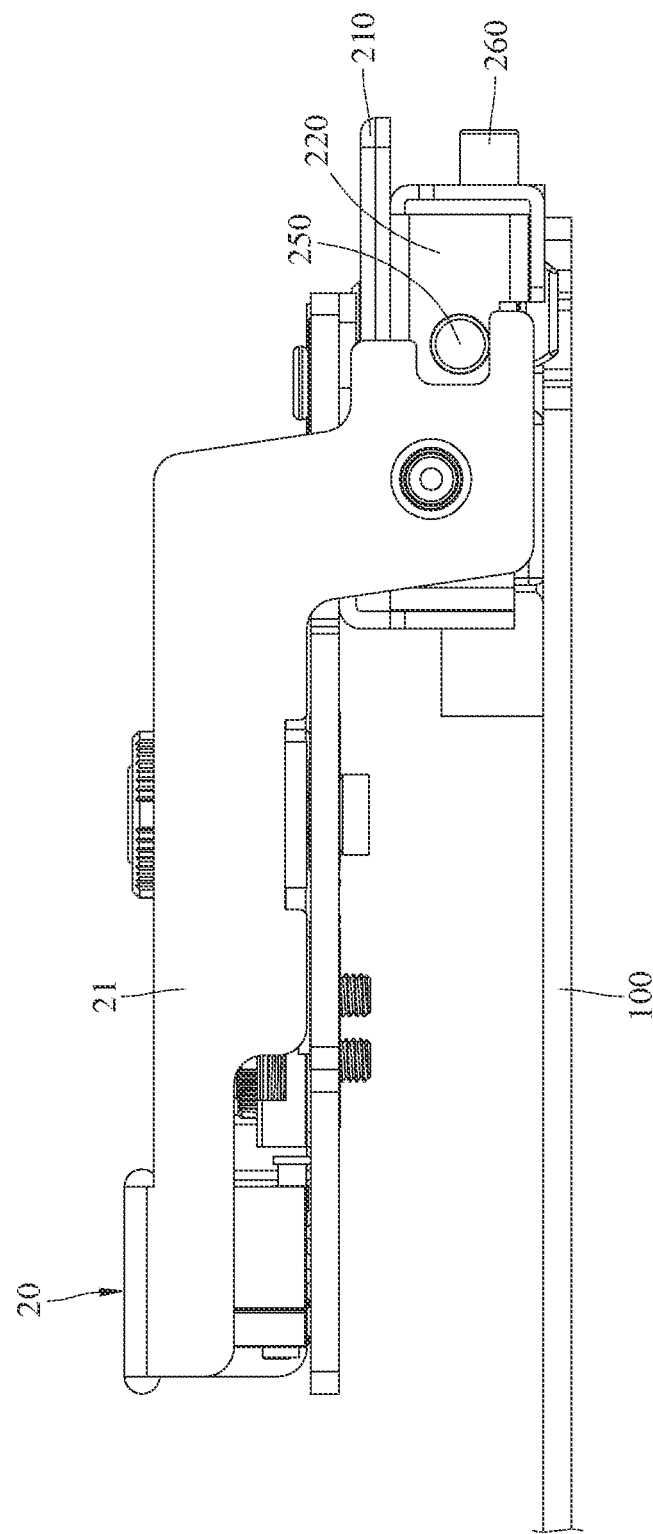
FIG. 3 is a side view showing that a first expansion card is horizontally installed on the server in FIG. 1.
Figure 4:
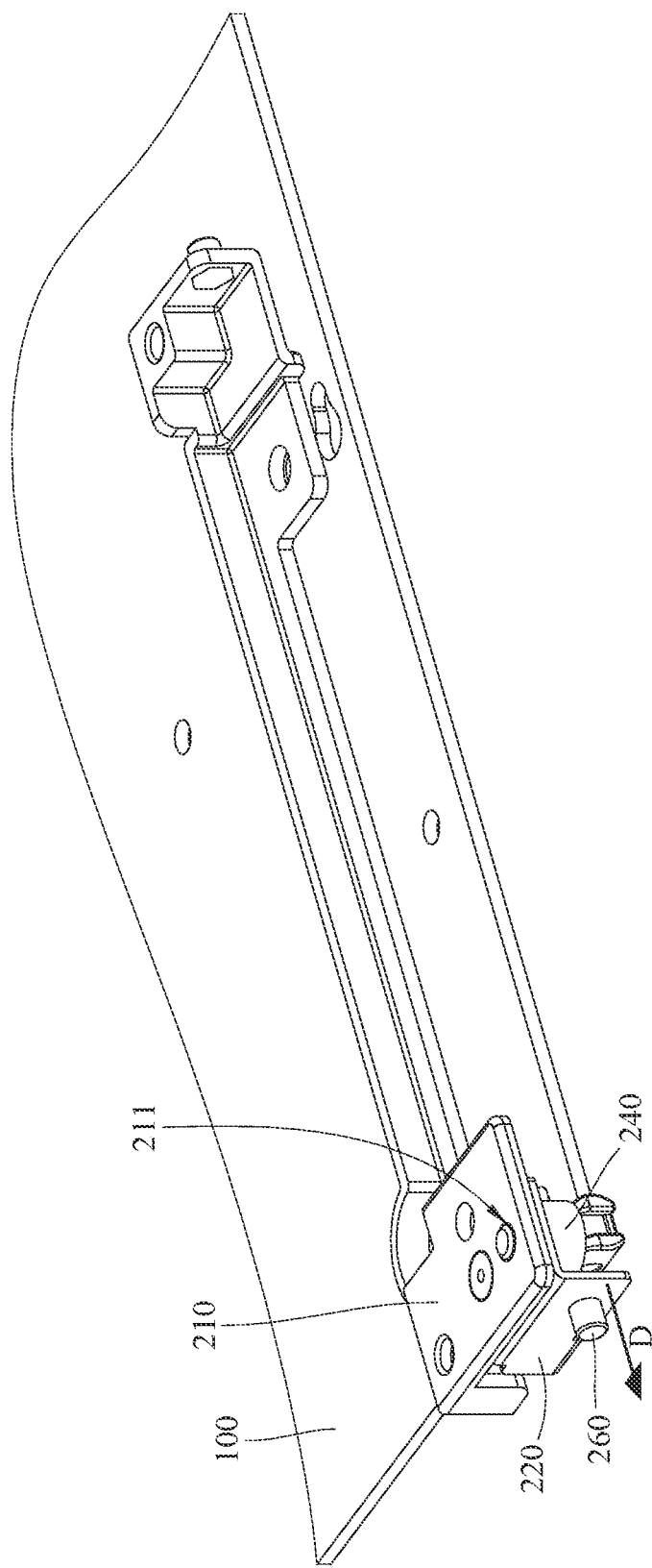
FIG. 4 is a partially enlarged perspective view showing that the adjustable base of the server in FIG. 1 is at a second mounting position.
Figure 5:
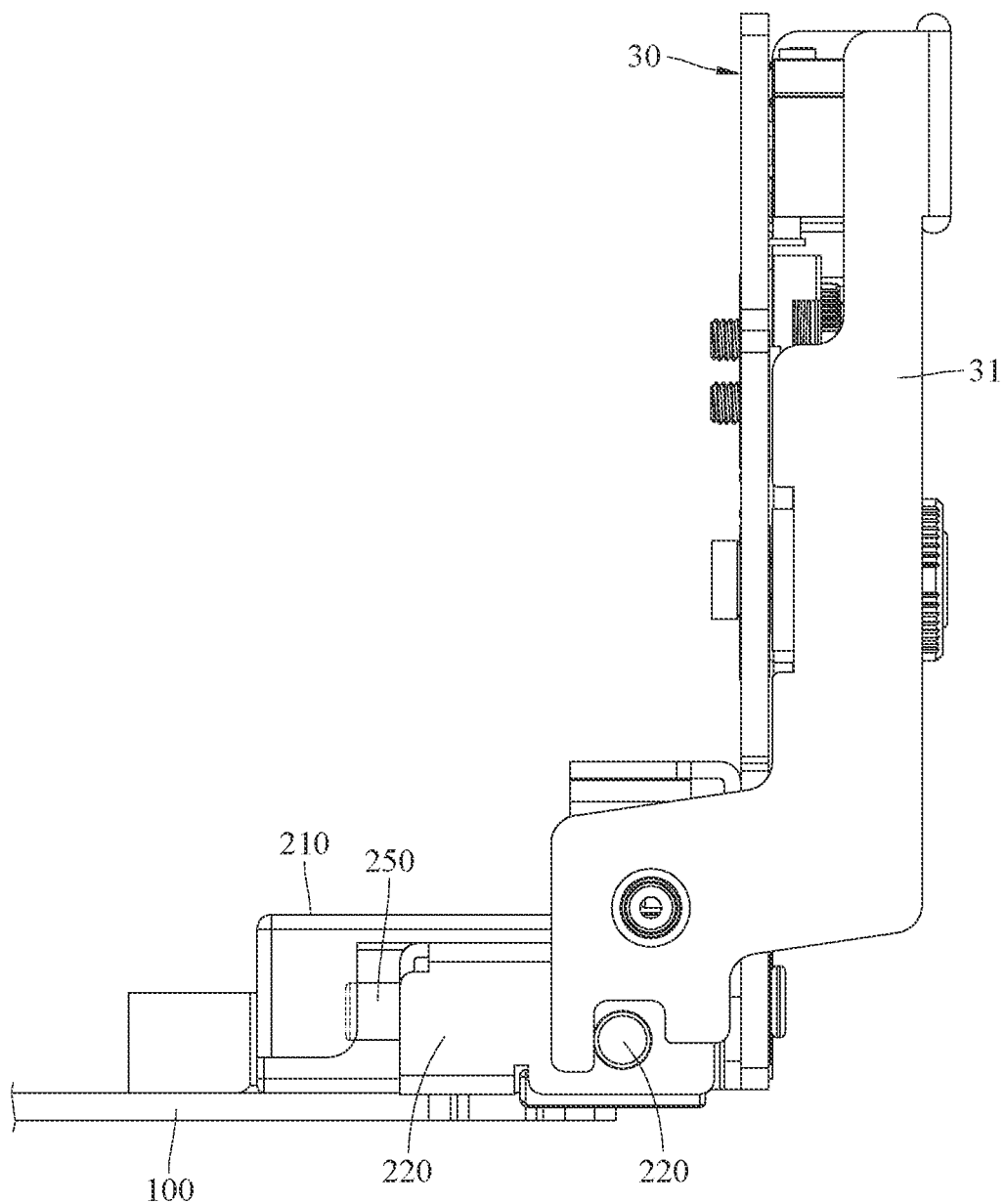
FIG. 5 is a side view showing that a second expansion card is vertically installed on the server in FIG. 4.

Please refer to FIGS. 3 to 5. FIG. 3 is a side view showing that a first expansion card 20 is horizontally installed on the server 10 in FIG. 1. FIG. 4 is a partially enlarged perspective view showing that the adjustable base 220 of the server 10 in FIG. 1 is at a second mounting position. FIG. 5 is a side view showing that a second expansion card 30 is vertically installed on the server 10 in FIG. 4.

The adjustable base 220 is configured to be rotated to the first mounting position (as shown in FIG. 3) or the second mounting position (as shown in FIGS. 4 and 5) relative to the fixed base 210. As shown in FIGS. 2 and 3, when the adjustable base 220 is at the first mounting position, the first protrusion 250 protrudes from the adjustable base 220 along a protruding direction D, thereby allowing the first expansion card 20 to be installed on or removed from the motherboard 100 horizontally. Also, the positioning component 240 is positioned in one of the positioning holes 211 to fix the adjustable base 220 in the first mounting position. The first protrusion 250 facilitates the horizontal installation or removal of the first expansion card 20 with respect to the motherboard 100 by, for example, cooperating with the handle 21 of the first expansion card 20.

As shown in FIGS. 4 and 5, when the adjustable base 220 is at the second mounting position, the second protrusion 260 protrudes from the adjustable base 220 along the protruding direction D, thereby allowing the second expansion card 30 to be installed on or removed from the motherboard 100 vertically. Also, the positioning component 240 is positioned in another one of the positioning holes 211 to fix the adjustable base 220 in the second mounting position. The second protrusion 260 facilitates the vertical installation or removal of the second expansion card 30 with respect to the motherboard 100 by, for example, cooperating with the handle 31 of the second expansion card 30. A position at which the first protrusion 250 is located when protruding along the protruding direction D (as shown in FIGS. 2 and 3) is different from a position at which the second protrusion 260 is located when protruding along the protruding direction D (as shown in FIGS. 4 and 5). In this embodiment, the first expansion card 20 and the second expansion card 30 are electrically connected to the motherboard 100 via, for example, a high-density connector.

Note that in this embodiment, in order to reduce the distance for the adjustable base 220 to be moved from the first mounting position to the second mounting position, the first protrusion 250 and the second protrusion 260 protrude from two adjacent sides of the adjustable base 220, respectively, but the invention is not limited thereto. In other embodiments, the first protrusion and the second protrusion may protrude from two opposite sides of the adjustable base, respectively.

In this embodiment, the server of this invention may be applied to Artificial Intelligence (AI) computing, edge computing, or may be used as a 5G server, a cloud server or a Vehicle-to-everything (V2X) server.

According to the mounting assembly and the server disclosed by above embodiments, the adjustable base is rotatably disposed on the fixed base, and the first protrusion and the second protrusion protrude from two different sides of the adjustable base, respectively. Thus, according to the actual requirement, the adjustable base is allowed to be moved to the first mounting position or the second mounting position to enable the vertical or horizontal installation of the expansion card. In this way, the mounting assembly can facilitate the expansion card to be installed on the motherboard along different directions, while preventing the manufacture cost and the difficulty of object management from being increased.

In addition, the first protrusion and the second protrusion protrude from different sides of the rotatable adjustable base, respectively. Thus, comparing to the prior art where multiple mounting protrusions are disposed on the same side of the fixed bracket, only one protrusion will protrude along the protruding direction regardless of the installing direction of the expansion card. Accordingly, the protrusion that does not protrude along the protruding direction will not occupy the space for manipulating the handle of the expansion card, thereby facilitating the expansion card to be installed on the motherboard via the mounting assembly.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A mounting assembly, configured for an installation and a removal of a first expansion card or a second expansion card with respect to a motherboard, the mounting assembly comprising:

a fixed base, configured to be fixed to the motherboard;

an adjustable base, rotatably disposed on the fixed base; and a first protrusion and a second protrusion, protruding from two different sides of the adjustable base, respectively;

wherein, the adjustable base is configured to be rotated to a first mounting position or a second mounting position relative to the fixed base, when the adjustable base is at the first mounting position, the first protrusion protrudes from the adjustable base along a protruding direction and is configured for horizontal installation and removal of the first expansion card with respect to the motherboard, when the adjustable base is at the second mounting position, the second protrusion protrudes from the adjustable base along the protruding direction and is configured for vertical installation and removal of the second expansion card with respect to the motherboard, and a position at which the first protrusion is located when protruding along the protruding direction is different from a position at which the second protrusion is located when protruding along the protruding direction.

2. The mounting assembly according to claim 1, further comprising a pivot, wherein the adjustable base is pivotally connected to the fixed base via the pivot.

3. The mounting assembly according to claim 2, further comprising a positioning component, wherein the fixed base comprises two positioning holes, the two positioning holes are arranged along a circumferential direction of the pivot, the positioning component is disposed through the adjustable base, when the adjustable base is at the first mounting position, the positioning component is positioned in one of the two positioning holes, and when the adjustable base is at the second mounting position, the positioning component is positioned at another one of the two positioning holes.

4. The mounting assembly according to claim 3, wherein the positioning component is a plunger.

5. The mounting assembly according to claim 1, wherein the first protrusion and the second protrusion protrude from two adjacent sides of the adjustable base, respectively.

6. A server, configured for an installation and a removal of a first expansion card or a second expansion card, the server comprising:
   a motherboard; and
   a mounting assembly, comprising:
      a fixed base, fixed to the motherboard;
      an adjustable base, rotatably disposed on the fixed base; and
      a first protrusion and a second protrusion, protruding from two different sides of the adjustable base, respectively;
   wherein, the adjustable base is configured to be rotated to a first mounting position or a second mounting position relative to the fixed base, when the adjustable base is at the first mounting position, the first protrusion protrudes from the adjustable base along a protruding direction and is configured for horizontal installation and removal of the first expansion card with respect to the motherboard, when the adjustable base is at the second mounting position, the second protrusion protrudes from the adjustable base along the protruding direction and is configured for vertical installation and removal of the second expansion card with respect to the motherboard, and a position at which the first protrusion is located when protruding along the protruding direction is different from a position at which the second protrusion is located when protruding along the protruding direction.

7. The server according to claim 6, wherein the mounting assembly further comprises a pivot, the adjustable base is pivotally connected to the fixed base via the pivot.

8. The server according to claim 7, wherein the mounting assembly further comprises a positioning component, the fixed base comprises two positioning holes, the two positioning holes are arranged along a circumferential direction of the pivot, the positioning component is disposed through the adjustable base, when the adjustable base is at the first mounting position, the positioning component is positioned in one of the two positioning holes, and when the adjustable base is at the second mounting position, the positioning component is positioned at another one of the two positioning holes.

9. The server according to claim 8, wherein the positioning component is a plunger.

10. The server according to claim 6, wherein the first protrusion and the second protrusion protrude from two adjacent sides of the adjustable base, respectively.

\* \* \* \* \*